(12) United States Patent
Park

(10) Patent No.: US 7,161,842 B2
(45) Date of Patent: Jan. 9, 2007

(54) FLASH MEMORY DEVICE AND METHOD OF ERASING FLASH MEMORY CELL THEREOF

(75) Inventor: Jin Su Park, Daegu-Shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 11/011,725

(22) Filed: Dec. 14, 2004

(65) Prior Publication Data

US 2006/0050594 A1    Mar. 9, 2006

(30) Foreign Application Priority Data

Sep. 3, 2004    (KR) ...................... 10-2004-0070228

(51) Int. Cl.
*G11C 16/04*    (2006.01)
(52) U.S. Cl. .......................... 365/185.33; 365/185.29; 365/185.23; 365/218; 365/230.03; 365/230.06
(58) Field of Classification Search .......... 365/185.29, 365/185.33, 185.23, 218, 230.03, 230.06
See application file for complete search history.

(56) References Cited

U.S. PATENT DOCUMENTS

| | | | | |
|---|---|---|---|---|
| 5,109,361 A | * | 4/1992 | Yim et al. ............. | 365/185.12 |
| 5,191,556 A | * | 3/1993 | Radjy .................... | 365/185.33 |
| 5,270,980 A | * | 12/1993 | Pathak et al. .......... | 365/185.12 |
| 5,287,318 A | * | 2/1994 | Kuki et al. .............. | 365/218 |
| 5,886,923 A | * | 3/1999 | Hung .................... | 365/185.11 |
| 5,995,417 A | | 11/1999 | Chen et al. ............ | 365/185.29 |
| 6,118,705 A | * | 9/2000 | Gupta et al. ........... | 365/185.29 |
| 6,236,594 B1 | * | 5/2001 | Kwon ................... | 365/185.11 |
| 2003/0189858 A1 | * | 10/2003 | Sowards et al. ........... | 365/200 |

FOREIGN PATENT DOCUMENTS

KR    10-2004-0008537    1/2004

OTHER PUBLICATIONS

Official Action for Korean Patent Application No. 2004-70228 dated Sep. 6, 2004.

* cited by examiner

*Primary Examiner*—Anh Phung
*Assistant Examiner*—Eric J. Wendler
(74) *Attorney, Agent, or Firm*—Marshall, Gerstein & Borun LLP

(57)    ABSTRACT

A flash memory device and method of erasing flash memory cells thereof are provided. The erase of a cell block unit or a page unit is effected by a word line switch included in a predecoder according to a page erase signal. If the erase is effected in the cell block unit, all word lines of one cell block are made to keep 0V. Meanwhile, if the erase is effected in the page unit, only word lines of a corresponding page are made to keep 0V and the remaining word lines are made floated, so that the erase is not performed. Accordingly, the erase can be carried out in the cell block unit or the page unit. It is thus possible to improve efficiency of data management.

5 Claims, 5 Drawing Sheets

FLASH MEMORY DEVICE AND METHOD OF ERASING FLASH MEMORY CELL THEREOF

FIELD OF THE TECHNOLOGY

This disclosure relates generally to a flash memory device and method of erasing flash memory cells thereof, and, more specifically, to a NAND type flash memory device in which an erase operation of a cell block unit or a page unit can be performed and method of erasing flash memory cells thereof.

BACKGROUND

Generally, a NAND type flash memory device consists of a plurality of cell blocks. Each of the cell blocks includes a plurality of cell strings to which a plurality of cells are serially connected, a plurality of bit lines, a plurality of word lines, drain select transistors connected between the cell strings and the bit lines, and source select transistors connected between the cell strings and a common source line. Meanwhile, a plurality of memory cells which share one word line constitutes one page, and all the cells share a P well. The memory cell further includes a pass transistor for supplying a predetermined voltage to the cell block. The pass transistor includes a high voltage transistor for drain select, a high voltage transistor for source select and a high voltage transistor for cell select.

In the NAND type flash memory device constructed above, in order to program data into memory cells, an erase operation is first performed and a program operation is then effected to only selected cells. However, the program operation on the NAND type flash memory device is carried out in a page unit but the erase operation is performed in a cell block unit because all the cells share the P well. A conventional method of erasing the NAND type flash memory device will be below described in short.

One of a plurality of cell blocks is selected. A power supply voltage is then applied to the gate terminal of each of a high voltage transistor for drain select, a high voltage transistor for source select and a high voltage transistor for cell select within a pass transistor connected to the selected cell block. Next, a voltage of 4.5V is applied to a drain select transistor and a source select transistor through the high voltage transistor for drain select and the high voltage transistor for source select. A voltage of 0V is then applied to a memory cell through the high voltage transistor for cell select. Furthermore, a voltage of 0V is applied to the gate terminal of each of a high voltage transistor for drain select, a high voltage transistor for source select and a high voltage transistor for cell select within a pass transistor connected to a non-selected cell block. In addition, an erase voltage is applied to the P well of the entire cell blocks. In the P well of the non-selected cell, however, when a voltage of the P well rises to the erase voltage, a voltage of word lines of anon-selected cell block increases because of a coupling effect by capacitance of the word lines and capacitance between the word lines and the P well. Accordingly, the non-selected cell block is not erased.

In the conventional NAND type flash memory device in which the erase is effected in the cell block unit as described above, even when only a selected page has to be erased so as to program only the selected page, one cell block has to be all erased. Accordingly, there is a problem in that efficiency in terms of data management is significantly lowered.

SUMMARY

In one aspect, the invention is directed to a flash memory device, which may include a plurality of cell blocks including a plurality of cell strings to which a plurality of cells are serially connected, wherein each of the cell strings is allocated with one bit line, and memory cells which share one word line among the plurality of the cells constitute a page, a block select circuit for selecting one of the cell blocks according to a block address, a predecoder for determining a bias of a plurality of global word lines depending on the erase of a cell block unit or a page unit according to a page address and a page erase signal, and a switching unit for applying a predetermined bias to the word lines of the cell block through the global word lines according to the output signal of the block select circuit.

The cell blocks may include drain select transistors connected between the cell strings and the bit lines, and source select transistors connected between the cell strings and a common source line.

The predecoder may include a word line decoder for selectively outputting a plurality of select signals according to the page address, and a plurality of word line switches each for receiving the page erase signal and each of the select signals and applying a predetermined bias depending on the erase of the cell block unit or the page unit through each of the plurality of the global word lines.

Each of the word line switches may include logical means for receiving the select signal and an inverted signal of the page erase signal, a first switch for outputting a first voltage, which causes a selected cell block or a selected page to be erased, to the global word lines according to an inverted output signal of the logical means, and a second switch for outputting a second voltage, which causes a non-selected cell block or a non-selected page not to be erased, to the global word lines according to the output signal of the logical means.

The logical means may include a NOR gate.

The first voltage may be 0V and the second voltage may be a voltage higher than a power supply voltage.

The word line switch may further include first boosting means for outputting a first boosting signal according to an inverted output signal of the logical means, thus driving the first switch, and second boosting means for outputting a second boosting signal according to the output signal of the logical means, thus driving the second switch.

The switching unit may include transistors for drain select connected between the drain select transistor and the predecoder, a plurality of transistors for cell select, which are connected between the word lines of the memory cell and the global word lines, and transistors for source select connected between the source select transistors and the predecoder.

In another aspect, the invention is directed to a method of erasing flash memory cells in a flash memory device, wherein the flash memory device comprises a plurality of cell blocks including a plurality of cell strings to which a plurality of cells are serially connected, wherein each of the cell strings is allocated with one bit line, cells that share one word line among the plurality of the cells constitute a page, drain select transistors are connected between the cell strings and the bit lines, and source select transistors are connected between the cell strings and a common source line, a block select circuit for selecting one of the cell blocks according to a block address, a predecoder for determining a bias of a plurality of global word lines depending on the erase of a cell block unit or a page unit according to a page address and a page erase signal, and a switching unit for applying a predetermined bias to the word lines of the cell block through the global word lines according to the output signal of the block select circuit, wherein the method may include after one of the cell blocks is selected according to the block address, a bias depending on the erase of the cell block unit or the page unit is applied to the word lines of a selected cell block or a selected page through the global word lines and the switching unit according to the page address and the page erase signal.

Bit lines and the source terminal of the selected cell block may be made floated, and the switching unit may then be enabled so that a second voltage is applied to the drain select transistors and the source select transistors and a first voltage is applied to the word lines, whereby the erase is effected.

Bit lines and the source terminal of a non-selected cell block may be made floated, and the switching unit may then be disabled so that the drain select transistors and the source select transistors are made floated and power is not applied to word lines of the non-selected cell block, whereby the erase is not performed.

Bit lines and the source terminal of the selected cell block may be made floated, the switching unit may then be enabled to supply a second voltage to the drain select transistors and the source select transistors, and the first voltage is applied to word lines of a selected page and the second voltage is applied to word lines of a non-selected page, whereby the erase is performed only on the selected page.

DETAILED DESCRIPTION

Figure 1:
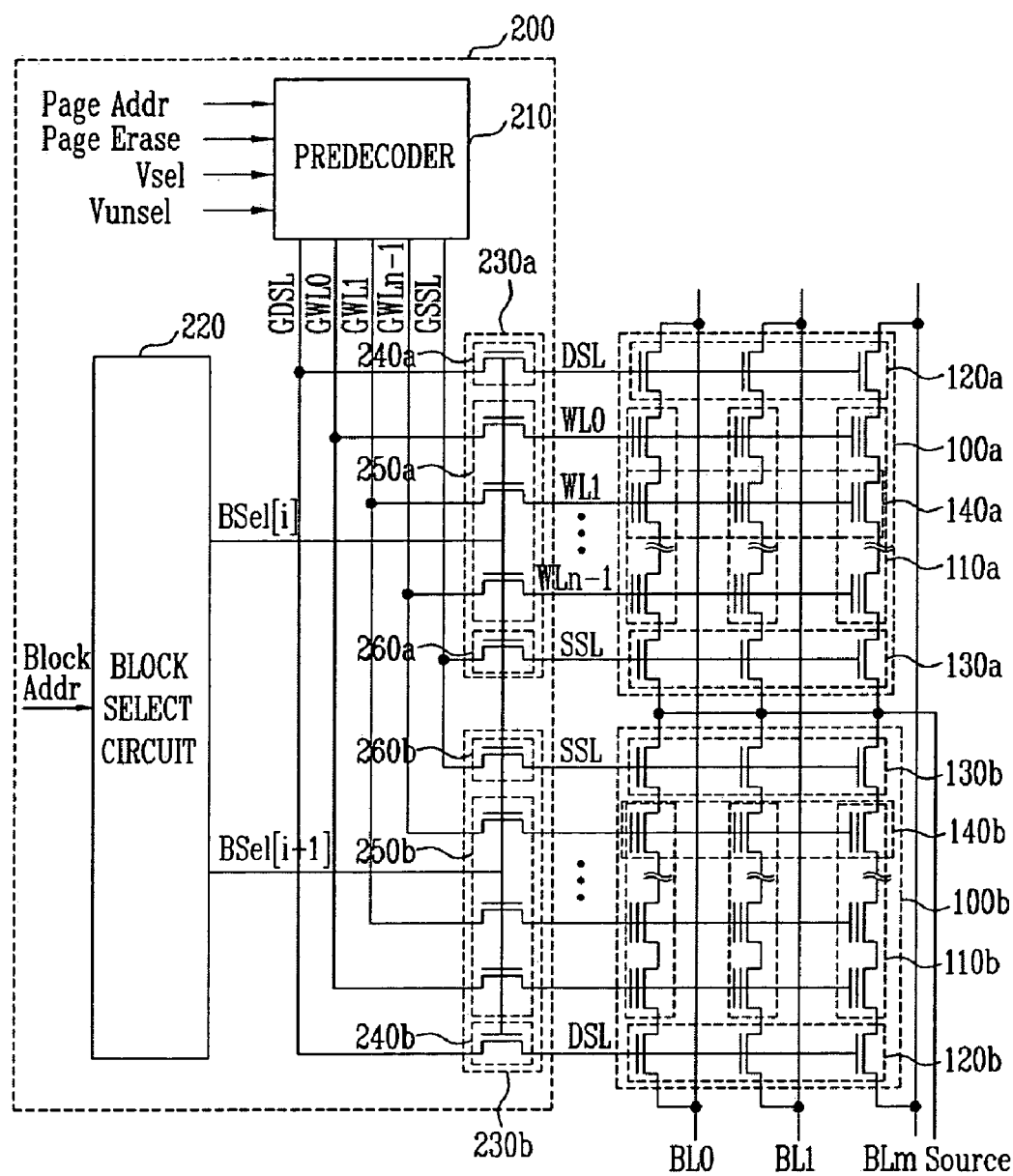
FIG. 1 is a circuit diagram of a NAND type flash memory device.

FIG. 1 is a circuit diagram of a NAND type flash memory device including a plurality of cell blocks 100a, 100b and a row decoder 200.

Referring to FIG. 1, each of the cell blocks 100a, 100b includes a plurality of cell strings 110a, 110b to which a plurality of cells are serially connected, the m number of bit lines BL, the n number of word lines WL, drain select transistors 120a, 12Gb connected between the cell strings 110a, 110b and the bit lines BL, and source select transistors 130a, 130b connected between the cell strings 110a, 110b and a common source line. Meanwhile, a plurality of memory cells that share a single word line constitutes one page 140a, 140b and all the cells share a P well. Further, the drain select transistors 120a, 120b share a drain select line DSL and the source select transistors 130a, 130b share a source select line SSL.

The row decoder 200 includes a predecoder 210, a block select circuit 220 and a plurality of pass transistors 230a, 230b. The predecoder 210 serves to determine a bias of a plurality of global word lines GWL0 to GWLn−1 depending on erase of a cell block unit or a page unit according to a page address signal Page Addr and a page erase signal Page Erase. The predecoder 210 supplies a select voltage (Vsel) or a non-select voltage (Vunsel) through the plurality of the global word lines GWL0 to GWLn−1. In this time, the select voltage (Vsel) is 0V and the non-select voltage (Vunsel) is a voltage higher than a power supply voltage (Vcc).

The block select circuit 220 outputs a block select signal BSel for selecting a block according to the block address Block Addr. The block select signals Bsel are adapted to turn on the pass transistors 230a, 230b of a selected cell block and to turn off the pass transistors 230a, 230b of a non-selected block. Therefore, the select voltage (Vsel) or the non-select voltage (Vunsel) is applied to the selected cell block through the plurality of the global word lines GWL0 to GWLn−1, the plurality of the pass transistors 230a, 230b and the word lines WL0 to WLn−1 of the selected cell block 100. Meanwhile, as the pass transistors 230a, 230b are turned off, the voltage is not applied to the non-selected cell block through the plurality of the global word lines GWL0 to GWLn−1, and the word lines WL0 to WLn−1 are kept floated.

Meanwhile, the pass transistors 230a, 230b serve as a switch for applying a given voltage to the word lines WL0 to WLn−1 within the cell block 100 through the global word lines GWL0 to GWLn−1. The pass transistors 230a, 230b include high voltage transistors for drain select 240a, 240b, high voltage transistors for source select 260a, 260b, and high voltage transistors for cell select 250a, 250b.

Figure 2:
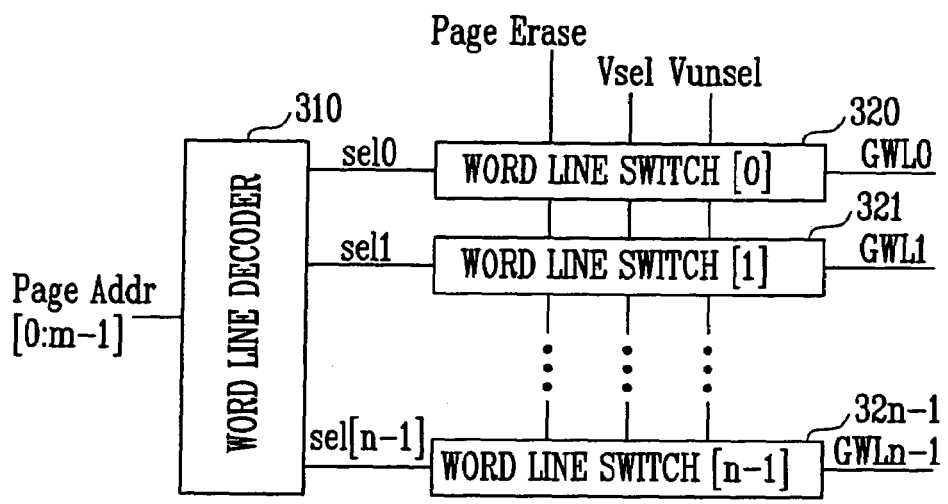
FIG. 2 is a block diagram showing a predecoder included in the NAND type flash memory device.

FIG. 2 is a block diagram showing a predecoder included in the NAND type flash memory device.

Referring to FIG. 2, the predecoder includes one word line decoder 310 and a plurality of word line switches 320 to 32n−1 in order to perform an erase operation in a page unit. The word line decoder 310 selectively outputs then number of select signals sel<0:n−1>according to the page address signal Page Addr<0:m−1>. The plurality of the word line switches 320 to 32n−1 supply the select voltage (Vsel) or the non-select voltage (Vunsel) through the global word lines GWL0 to GWLn−1 according to the page erase signal Page Erase and the plurality of the select signals sel<0:n−1>. according to the page erase signal Page Erase and the plurality of the select signals sel<0: n−1>.

Figure 3:
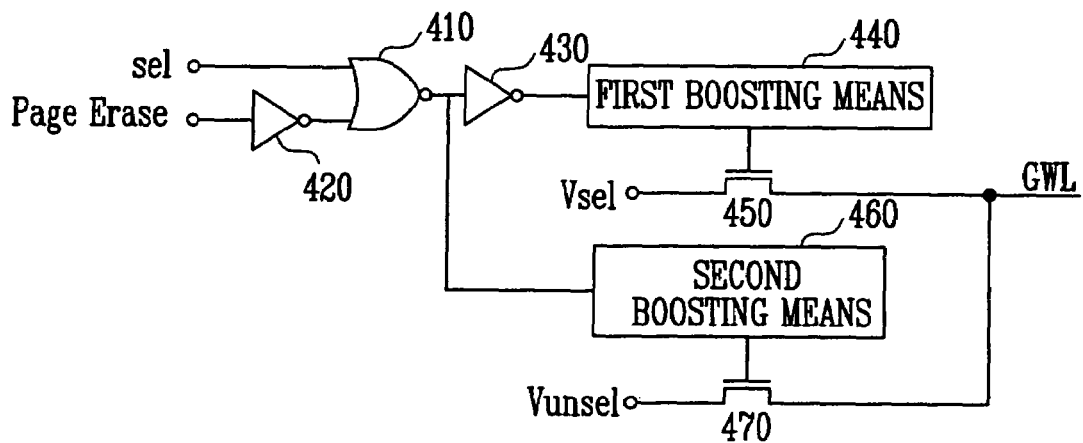
FIG. 3 is a block diagram showing a word line switch included in the predecoder.

FIG. 3 is a block diagram showing a word line switch included in the predecoder.

Referring to FIG. 3, a NOR gate 410 receives the select signal sel and the page erase signal Page Erase which is inverted through a first inverter 420 and then determines an output signal. First boosting means 440 outputs a first boosting signal depending on the output signal of a second inverter 430, which inverts the output signal of the NOR gate 410. A second boosting means 460 outputs a second boosting signal depending on the output signal of the NOR gate 410. A first NMOS transistor 450 transfers the select voltage (Vsel) to the global word lines GWL according to the first boosting signal of the first boosting means 440, and the second NMOS transistor 470 transfers the non-select voltage (Vunsel) to the global word lines GWL according to the second boosting signal of the second boosting means 460. In this time, the select voltage (Vsel) is 0 V and the non-select voltage (Vunsel) is a voltage higher than the power supply voltage (Vcc). Furthermore, if an erase operation is effected on the cell block unit, the page erase signal Page Erase is inputted as a LOW level. Meanwhile, the first and second boosting means 440 and 460 are adapted to generate voltages which are respectively higher than the select voltage (Vsel) and the non-select voltage (Vunsel) so that the select voltage (Vsel) and the non-select voltage (Vunsel) can be transferred to the global word lines GWL without the loss of the threshold voltage when they are high.

A method of driving the word line switch constructed above according to the present invention will be below described.

A) In the case of a cell block selected in an erase operation of a cell block unit The select signal sel is applied as a HIGH level and the page erase signal Page Erase is applied as a LOW level. The NOR gate 410 receives the select signal sel of the HIGH level and the page erase signal Page Erase of a HIGH level, which is inverted through the first inverter 420, and then outputs a signal of a LOW level. The output signal of the LOW level of the NOR gate 410 disables the second boosting means 460. A signal of a HIGH level, which is inverted from the output signal of the LOW level of the NOR gate 410 through the second inverter 430, enables the first boosting means 440. Accordingly, the first NMOS transistor 450 is turned on and the select voltage (Vsel) is supplied to the global word lines GWL. In this time, since a plurality of pass transistors connected to a selected cell block are turned on, the select voltage (Vsel) is applied to the selected cell block.

B) In the case of a cell not selected in an erase operation of a cell block unit The select signal sel is applied as a LOW level and the page erase signal Page Erase is applied as a LOW level. The NOR gate 410 receives the select signal sel of the LOW level and the page erase signal Page Erase of a HIGH level, which is inverted from the LOW level through the first inverter 420, and then outputs a signal of a LOW level. The output signal of the LOW level of the NOR gate 410 disables the second boosting means 460. A signal of a HIGH level, which is inverted from the output signal of the LOW level of the NOR gate 410 through the second inverter 430, enables the first boosting means 440. Accordingly, the first NMOS transistor 450 is turned on and the select voltage (Vsel) is supplied to the global word lines GWL. In this time, since pass transistors connected to a non-selected cell block are turned off, the select voltage (Vsel) is not applied to the non-selected cell block.

C) In the case of a page selected in an erase operation of a page unit

The select signal sel is applied as a HIGH level and the page erase signal Page Erase is applied as a HIGH level. The NOR gate 410 receives the select signal sel of the HIGH level and the page erase signal Page Erase of a LOW level, which is inverted from the HIGH level through the first inverter 420, and then outputs a signal of a LOW level. The output signal of the LOW level of the NOR gate 410 disables the second boosting means 460. A signal of a HIGH level, which is inverted from the output signal of the LOW level of the NOR gate 410 through the second inverter 430, enables the first boosting means 440. Accordingly, the first NMOS transistor 450 is turned on and the select voltage (Vsel) is supplied to the global word lines GWL. In this time, since a plurality of pass transistors connected to a selected cell block are turned on, the select voltage (Vsel) is applied to the selected cell block.

D) In the case of a page not selected in an erase operation of a page unit

The select signal sel is applied as a LOW level and the page erase signal Page Erase is applied as a HIGH level. The NOR gate 410 receives the select signal sel of the LOW level and the page erase signal Page Erase of a LOW level, which is inverted from the HIGH level through the first inverter 420, and then outputs a signal of a HIGH level. The output signal of the HIGH level of the NOR gate 410 enables the second boosting means 460. A signal of a LOW level, which is inverted from the output signal of the HIGH level of the NOR gate 410 through the second inverter 430, disables the first boosting means 440. Accordingly, the second NMOS transistor 470 is turned on and the non-select voltage (Vunsel) is supplied to the global word lines GWL. In this time, since a plurality of pass transistors connected to a selected cell block are turned on, the non-select voltage (Vunsel) is applied to non-selected pages of the selected cell block.

Figure 4A:
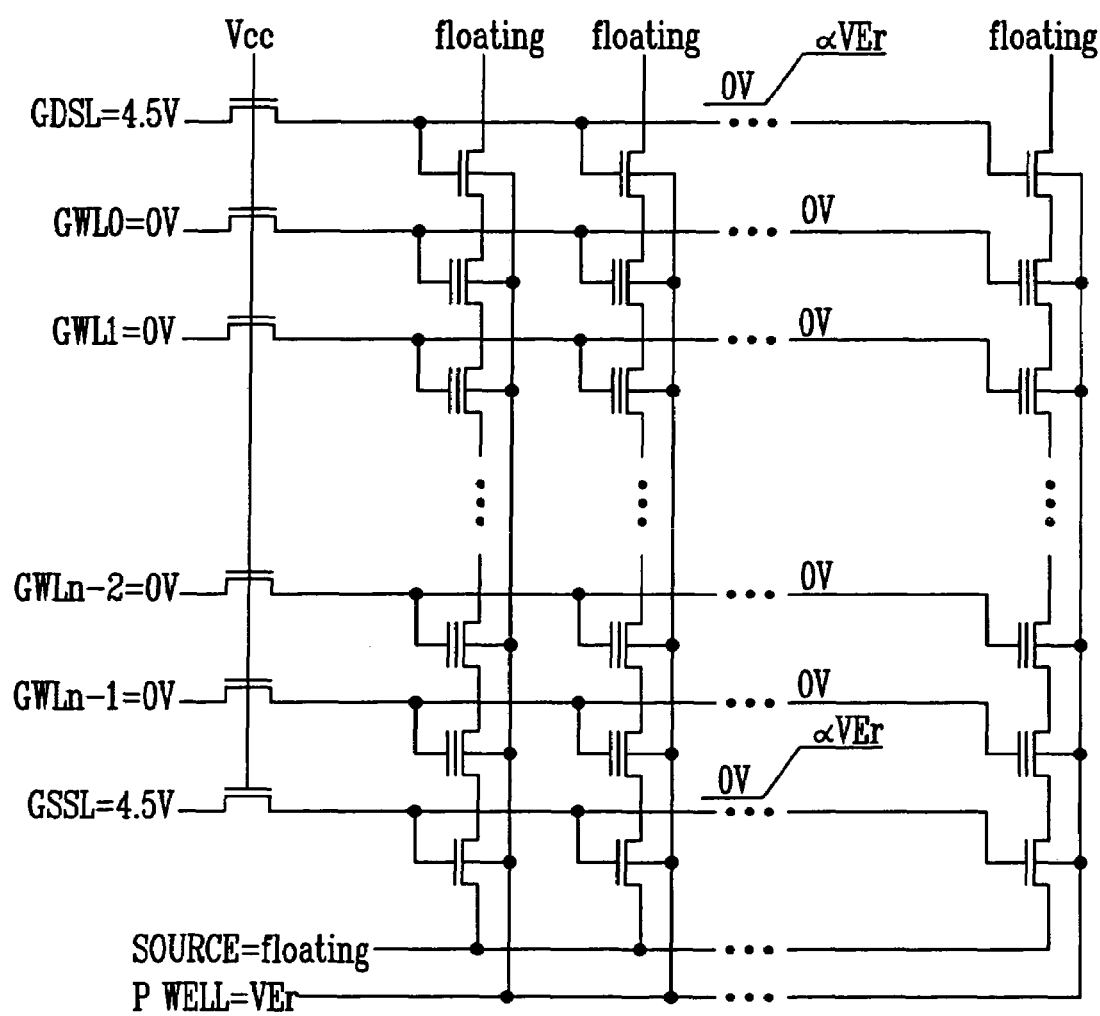
FIGS. 4a to 4c are circuit diagrams for explaining states of cell blocks in the method of erasing the NAND type flash memory device.
Figure 4B:
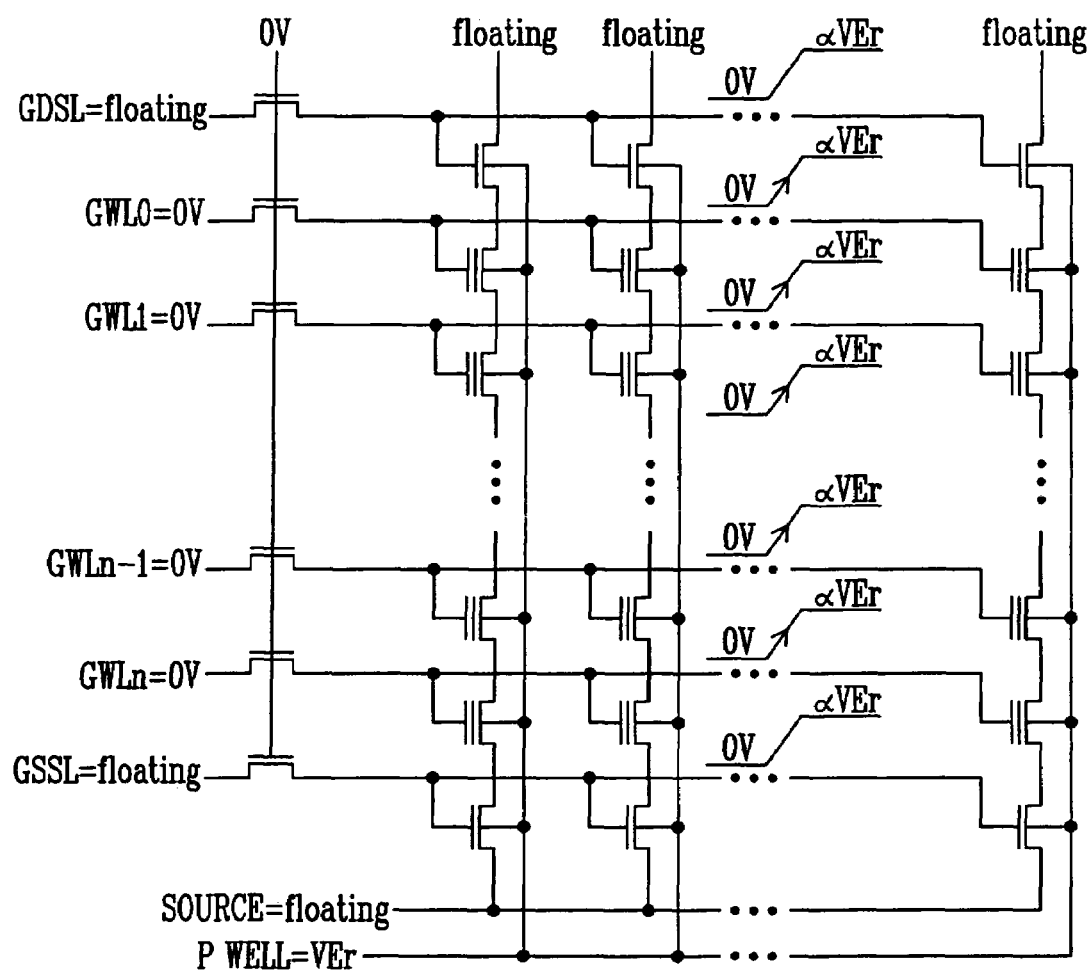
Figure 4C:
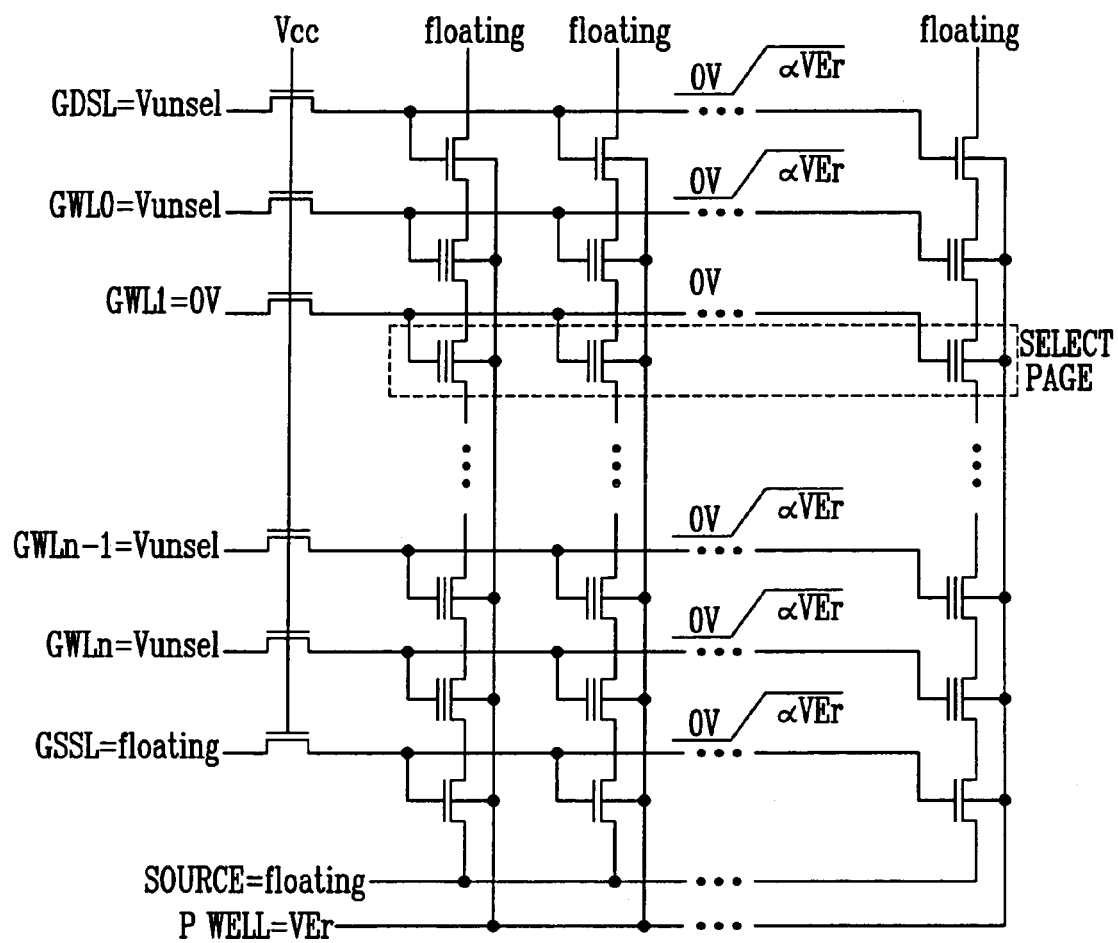

FIGS. 4a to 4c are circuit diagrams for explaining states of cell blocks and pass transistors depending on the erase of the NAND type flash memory device. FIG. 4a is a circuit diagram showing a cell block that is selected in an erase operation of the cell block unit. FIG. 4b is a circuit diagram showing a cell block that is not selected in an erase operation of the cell block unit. FIG. 4c is a circuit diagram showing a cell block in an erase operation of the page unit.

Referring to FIG. 4a, a select voltage (Vsel) of 0 V is applied through the global word lines GWL0 to GWLn−1 of a selected cell block and a voltage of 4.5 V is applied through the global drain select line GDSL and the global source select line GSSL. In this time, the power supply voltage (Vcc) is applied to the pass transistors, which are thus turned on. Accordingly, a voltage of 0 V is applied to the word lines of the selected cell block. In this state, if an erase voltage (VEr) is applied to the P well, the erase voltage (VEr) is applied between the word lines of the selected cell block and the P well, so that erase is performed according to a F–N tunneling phenomenon.

Referring to FIG. 4b, a select voltage (Vsel) of 0 V is applied through the global word lines GWL0 to GWLn−1 of a non-selected cell block, and a global drain select line GDSL and a global source select line GSSL are made floated. In this time, a voltage of 0 V is applied to the pass transistors, which are thus turned off. Accordingly, the word lines of the selected cell block are not applied with power. In this state, if the erase voltage (VEr) is applied to the P well of the non-selected cell block, while the voltage of the P well rises to the erase voltage (VEr), a voltage of word lines of the non-selected cell block increases because of a coupling effect due to capacitance of the word lines and capacitance between the word lines and the P well. Accordingly, the erase for the non-selected cell block is not effected.

Referring to FIG. 4c, a select voltage (Vsel) of 0 V is applied only to the global word line GWL1 connected to a selected page. A non-select voltage (Vunsel) higher than the power supply voltage (Vcc) is applied to the remaining global word lines, the drain select line and the source select line. In this time, pass transistors connected to the selected page are turned on, but pass transistors connected to non-selected pages are turned off. Accordingly, the select voltage (Vsel) is applied to the word lines of the selected page, but the non-select voltage (Vunsel) is not applied to the word lines of the selected page. In this state, if the erase voltage (VEr) is applied to the P well, the erase voltage (VEr) is applied between the word lines of the selected page and the P well, so that the erase is performed according to the F–N tunneling phenomenon. However, in the case of the non-selected pages, while a voltage of the P well increases to the erase voltage (VEr), a voltage of the word lines increases as much as αVEr because of a coupling effect due to capacitance of a corresponding word line and capacitance between the word line and the P well. Accordingly, the erase is not effected because a difference in voltage between the word line and the P well is small. In this time, the bit line and the common source line are kept floated.

For reference, Table 1 shows bias conditions for a read operation, a program operation, an erase operation of a cell block unit and an erase operation of a page unit, of a NAND type flash memory device.

TABLE 1

|           | Read  | Program | Block Erase | Page Erase |
|-----------|-------|---------|-------------|------------|
| Vsel      | 0 V   | 18 V    | 0 V         | 0 V        |
| Vunsel    | 4.5 V | 10 V    | don't care  | >Vcc       |
| sel GWL   | 0 V   | 10 V    | 0 V         | 0 V        |
| unsel GWL | 4.5 V | 10 V    | Vunsel      | >Vcc       |
| sel WL    | 0 V   | 18 V    | 0 V         | 0 V        |
| unsel WL  | 4.5 V | 10 V    | 0 V         | floating   |

As described above, an erase operation of a cell block unit or a page unit can be effected by means of word line switches included in a predecoder according to a page erase signal. If the erase operation is performed in the cell block unit, all word lines of one cell block are made to keep 0 V. Meanwhile, if the erase operation is effected in the page unit, only word lines of a corresponding page are made to keep 0 V and the remaining word lines are floated so that the erase operation is not performed. Accordingly, the efficiency of data management is improved because an erase operation is performed in a cell block unit or a page unit.

Although certain examples of methods and apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A flash memory device, comprising:
   a plurality of cell blocks including a plurality of cell strings to which a plurality of memory cells are serially connected, wherein each of the cell strings is allocated with one bit line, and memory cells which share one word line among the plurality of the memory cells constitute a page;
   a block select circuit for selecting one of the cell blocks according to a block address;
   a predecoder including a word line decoder for selectively outputting a plurality of select signals according to a page address, and a plurality of word line switches each for receiving a page erase signal and each of the select signals and applying a predetermined bias depending on the erase of the cell block unit or the page unit through each of a plurality of global word lines; and
   a switching unit for applying a predetermined bias to the word lines of the cell block through the global word lines according to the output signal of the block select circuit,
   wherein each of the word line switches comprises:
      a combination circuit for generating a signal in response to the select signals and the page erase signal;
      a first switch for outputting a first voltage, which causes a selected cell block or a selected page to be erased, to the global word lines according to an inverted output signal of the combination circuit; and
      a second switch for outputting a second voltage, which causes a non-selected cell block or a non-selected page not to be erased, to the global word lines according to the output signal of the combination circuit.

2. The flash memory device as claimed in claim 1, wherein the logical means combination circuit comprises a NOR gate.

3. The flash memory device as claimed in claim 1, wherein the first voltage is 0 V and the second voltage is a voltage higher than a power supply voltage.

4. The flash memory device as claimed in claim 1, wherein the word line switch further comprises: first boosting means for outputting a first boosting signal according to an inverted output signal of the logical means combination circuit, thus driving the first switch; and second boosting means for outputting a second boosting signal according to the output signal of the combination circuit, thus driving the second switch.

5. The flash memory device as claimed in claim 1, wherein the switching unit comprises: transistors for drain select connected between a drain select transistor and the predecoder; a plurality of transistors for cell select, which are connected between the word lines of the memory cell and the global word lines; and transistors for source select connected between a source select transistors and the predecoder.

* * * * *